United States Patent
Gleason et al.

(10) Patent No.: US 7,485,565 B2
(45) Date of Patent: *Feb. 3, 2009

(54) NICKEL BONDING CAP OVER COPPER METALIZED BONDPADS

(75) Inventors: Jeffery N. Gleason, Meridian, ID (US); Joseph T. Lindgren, Boise, ID (US)

(73) Assignee: Micron Technologies, Inc., Boise, ID (US)

( * ) Notice: Subject to any disclaimer, the term of this patent is extended or adjusted under 35 U.S.C. 154(b) by 170 days.

This patent is subject to a terminal disclaimer.

(21) Appl. No.: 11/505,773

(22) Filed: Aug. 17, 2006

(65) Prior Publication Data

US 2006/0276016 A1  Dec. 7, 2006

Related U.S. Application Data

(60) Continuation of application No. 10/915,757, filed on Aug. 11, 2004, now Pat. No. 7,186,636, which is a division of application No. 10/224,771, filed on Aug. 21, 2002, now Pat. No. 6,825,564.

(51) Int. Cl.
*H01L 21/44* (2006.01)

(52) U.S. Cl. .............................. 438/617; 257/E21.508
(58) Field of Classification Search ......... 438/612–617; 257/E21.508
See application file for complete search history.

(56) References Cited

U.S. PATENT DOCUMENTS

| | | | |
|---|---|---|---|
| 3,599,060 | A | 8/1971 | Triggs et al. |
| 5,869,126 | A | 2/1999 | Kukanskis |
| 6,259,161 | B1 | 7/2001 | Wu et al. |
| 6,281,090 | B1 | 8/2001 | Kukanskis et al. |
| 6,335,104 | B1 | 1/2002 | Sambucetti et al. |
| 6,362,089 | B1 | 3/2002 | Molla et al. |
| 6,593,221 | B1 | 7/2003 | Lindgren |
| 6,897,761 | B2 | 5/2005 | Ernsberger et al. |
| 7,186,636 | B2 * | 3/2007 | Gleason et al. ............. 438/612 |

* cited by examiner

*Primary Examiner*—Richard A. Booth
(74) *Attorney, Agent, or Firm*—Fletcher Yoder

(57) ABSTRACT

A method for forming a nickel cap layer over copper metalized bond pad is disclosed in which the phosphorous content of the nickel cap, and particularly the surface of the nickel cap, may be controlled. The phosphorous content of the surface of the nickel cap is suitably determined such that oxidation is inhibited. The resulting nickel cap may be wire-bonded directly, without the deposition of a gold cap layer.

20 Claims, 4 Drawing Sheets

NICKEL BONDING CAP OVER COPPER METALIZED BONDPADS

CROSS-REFERENCE TO RELATED APPLICATIONS

This application is a continuation of U.S. application Ser. No. 10/915,757, filed on Aug. 11, 2004, now U.S. Pat. No. 7,186,636 which is a divisional of U.S. application Ser. No. 10/224,771, filed on Aug. 21, 2002 now U.S. Pat. No. 6,825,564.

BACKGROUND OF THE INVENTION

1. Field of the Invention

This present invention relates generally to the field of integrated circuit connectivity and, more specifically, to the field of wire bonding integrated circuits using copper metalized bond pads.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In today's complex computer systems, speed, flexibility, and reliability in timing and control are issues typically considered by design engineers tasked with meeting customer requirements while implementing innovations which are constantly being developed for computer systems and their components. Computer systems typically include a variety of electrically interconnected integrated circuit (I/C) packages which perform a variety of functions, including memory and processing functions. These I/C packages typically include numerous bond pads that interface with external connectors, used to join the assorted circuits together. Typically, the external connectors that interface with the bond pads are either wires or solder balls.

Until recently, bond pads typically have been formed from aluminum due to that metal's relatively low resistivity and good current-carrying capabilities. Additionally, aluminum adheres well to silicon dioxide, is available in high purity, and has a naturally low contact resistance with silicon. While gold and copper are more conductive than aluminum, both metals are typically used less frequently for reasons not related to conductivity, such as their high susceptibility to contamination or oxidation.

Recently, however, there has been renewed interest in copper metalization due to the superior conductivity and scalability of copper. In particular, the reductions necessary for 0.25 µm and smaller scale devices have spurred interest in copper as an alternative to aluminum. For example, some vias or other interconnect structures may be too narrow to form efficiently from aluminum. Other advantages of copper, include its superior conductivity, good step coverage during deposition processes, resistance to electromigration, and low temperature deposition.

A disadvantage of copper, however, is its susceptibility to oxidation. The resulting layer of surface oxidation is unsuitable for forming electrical contacts and is difficult to weld. The susceptibility of copper bond pads to oxidation is particularly problematic since the oxidation can inhibit the wire bonding of I/C dies and substrates. The technique of wire bonding includes bonding a thin wire to a chip or die bond pad, spanning the wire to the inner lead of the package lead frame, and bonding the other end of the wire to the associated inner lead bond pad. Bonding may be performed by a variety of means including thermocompression, thermosonic, and wedge (or ultrasonic) bonding. The process of wire bonding requires not only precise wire placement but also good electrical contact at both ends. Aluminum and gold wire have typically been used for wire bonding due to their acceptable conductivity and scalability. Gold wire is of particular interest in ball bonding as it does not need a cover gas after ball formation or flame off.

As noted, however, oxidation on copper inhibits useful bonds from being formed on copper bond pads. Current techniques for addressing this problem include depositing a layer of nickel upon the layer of copper and then coating the layer of nickel with a layer of gold. The nickel layer serves as a barrier layer, preventing migration of the copper through the gold. If allowed, such migration would lead to copper oxidation, resulting in poor solderability and increased contact resistance. The nickel barrier layer is typically electrolessly plated. The selective nature of electroless plating allows targeted plating of the area of interest as opposed to non-selective techniques such as electrodeposition. Additionally, electroless plating is typically preferred to the use of immersion solutions when plating onto thin layers since immersion solutions typically consume the underlying material and may thereby create adhesion issues with underlying layers. Electroless plating, however, does not degrade underlying thin layers, and may also plate thicker layers of material, offering protection against the ultrasonic energy of the wirebonder.

While the use of a gold cap allows wire bonding to the copper bond pads, the necessity of the gold layer presents distinct problems in addition to the need for a barrier layer. For example, gold is expensive and its supply is often unpredictable, leading to elevated costs. It would be preferable, therefore, to be able to rely solely upon a layer of nickel, without the gold cap, both in terms of cost and in terms of reducing the number of production steps. The present invention may address one or more of the concerns set forth above.

BRIEF DESCRIPTION OF THE DRAWINGS

Certain advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
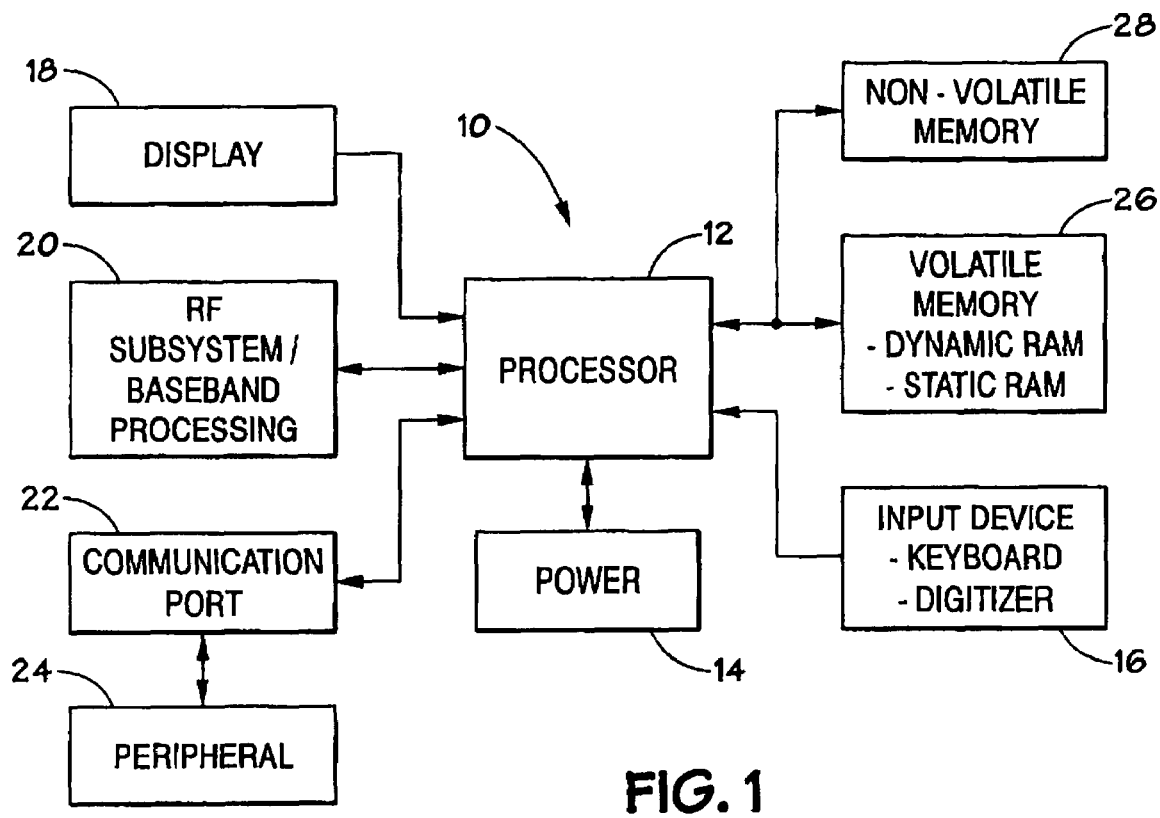
FIG. 1 illustrates a block diagram of an exemplary processor-based device.

Turning now to the drawings, and referring initially to FIG. 1, a block diagram depicting an exemplary processor-based system, generally designated by reference numeral 10, is illustrated. The system 10 may be any of a variety of types such as a computer, computer peripheral, network device, biomedical device, audio or visual device, communications apparatus, control circuit, etc. In a typical processor-based device, a processor 12, such as a microprocessor, controls the processing of sytem functions and requests in the system 10. Further, the processor 12 may comprise a plurality of processors which share system control.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be couple to the processor 12. The RF sub-system/baseband processor 20 may include an antenna that is coupled to an RF receiver and to an RF transmitter (not shown). A communications port 22 may also be coupled to the processor 12. The communications port 22 may be adapted to be coupled to one or more peripheral devices 24 such as a modem, a printer, a computer, or to a network, such as a local area network, remote area network, intranet, or the Internet, for instance.

Because the processor 12 controls the functioning of the system 10 by implementing software programs. Generally, the memory is coupled to the processor 12 to store and facilitate execution of various programs. For instance, the processor 12 may be coupled to the volatile memory 26 which may include Dynamic Random Access Memory (DRAM) and/or Static Random Access Memory (SRAM). The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. The volatile memory 26 on the other hand, is typically quite large so that it can store dynamically loaded applications and data. Additionally, the non-volatile memory 28 may include a high capacity memory such as a tape or disk drive memory.

Figure 2:
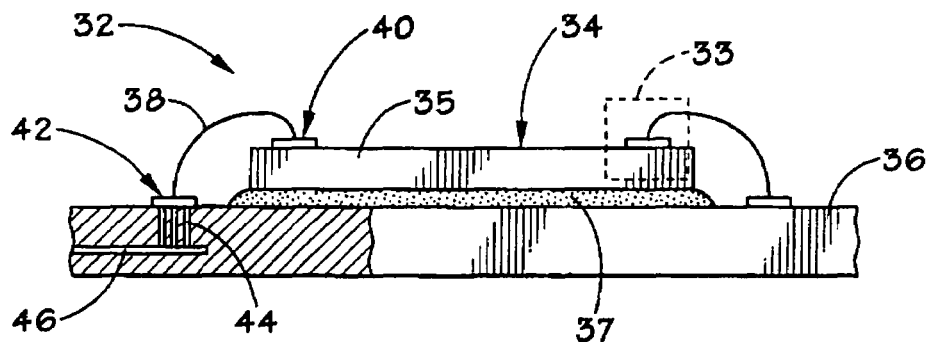
FIG. 2 illustrates a cross-sectional view of a wire bonded chip package in accordance with the present invention with a portion of the package presented in blown-up detail of FIG. 2A.
Figure 2A:
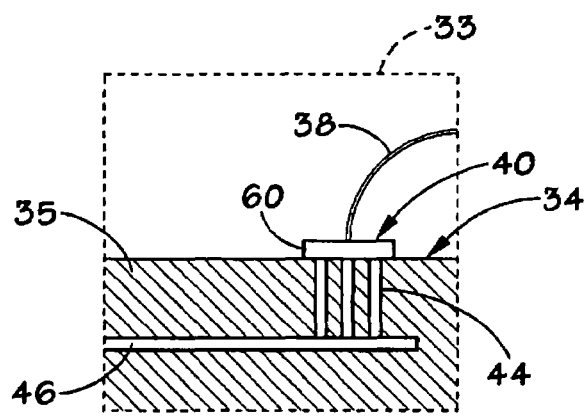

The chips used in the system 10 of FIG. 1 may use copper as a conductive medium or to form conductive interfaces. An I/C package using copper based conductors and contacts, such as might be used in a system 10, is depicted in FIG. 2. Such I/C packages are typically used in memory chips, processor chips, and application-specific integrated circuits such as those used in a computer system 10. Such I/C packages may also be used in systems such as biomedical devices, i.e. pacemakers, vehicular control circuits, and consumer electronic goods, i.e. stereos, televisions, game systems, cell phones, and monitors. FIG. 2 generally illustrates a partial cross-sectional view depicting an exemplary encapsulated I/C package 32 with a region 33 of a chip 34 shown in the blown-up perspective of FIG. 2A. Cross-sectional lines have been omitted for clarity. The I/C package 32 includes an I/C die or chip 34, which typically includes a semiconductive substrate 35 such as a silicon or germanium arsenide, upon which conductive interfaces or structures may be formed. The I/C chip 34 is physically mounted on a lead frame or other mounting substrate 36 via a die attach material 37, such as an epoxy adhesive, via eutectic bonding, or by other means.

The bond wires 38 connect the chip bond pads 40 and the substrate bond pads 42, thereby electrically coupling the I/C chip 34 to the mounting substrate 36. The bond pads 40, 42 are disposed upon a contact regions of the I/C chip 34 located upon the semiconductive substrate 35 and upon the mounting substrate 36 respectively. The contact regions of the I/C chip 34 and the mounting substrate 36 are in electrical contact with portions of the integrated circuit and with other electrical interconnect structures. In particular, the mounting substrate 36 and the I/C chip 34 both typically include vias 44 which provide an electrical signal path from the bond pads 40, 42 to a trace layer 46 or other interconnect structure. This system of electrical interconnection allows the I/C chip 34 to be electrically coupled to a printed circuit board (PCB) or other component for incorporation into the processor-based system 10.

Figure 3:
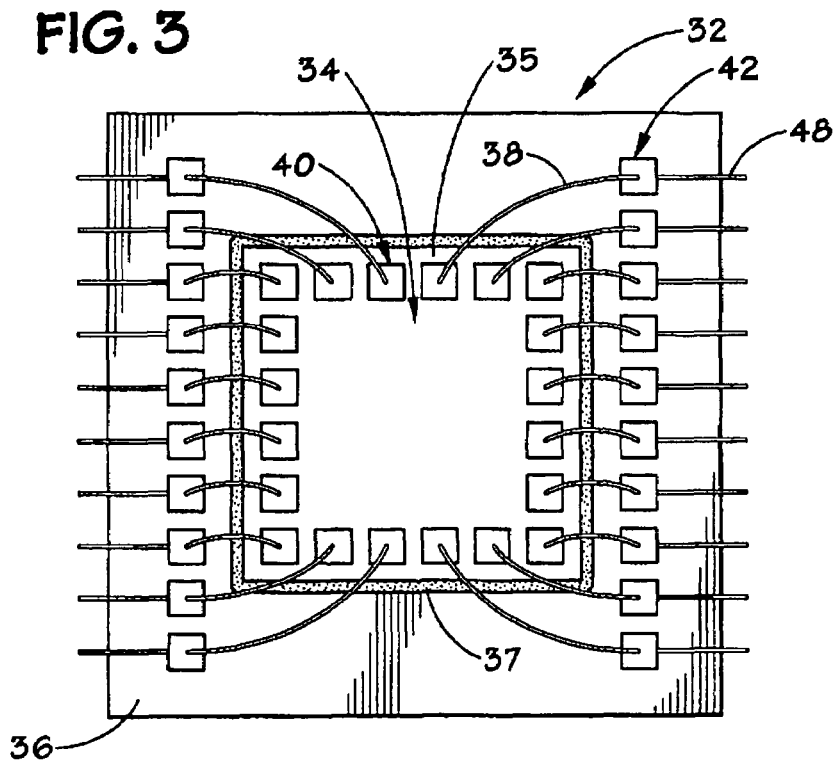
FIG. 3 illustrates a plan view of a wire bonded chip package in accordance with one aspect of the present invention.

FIG. 3 illustrates a plan view depicting the exemplary I/C package 32. The I/C chip 34 is disposed upon a mounting substrate 36, such as a lead frame. Bond wires 38 electrically connect the chip bond pads 40 and the substrate bond pads 42. The substrate bond pads 42 may in turn be electrically connected to a trace layer 46 by vias 44 (not shown) or may be electrically connected to other interconnect structures by lead contacts 48.

Figure 4:
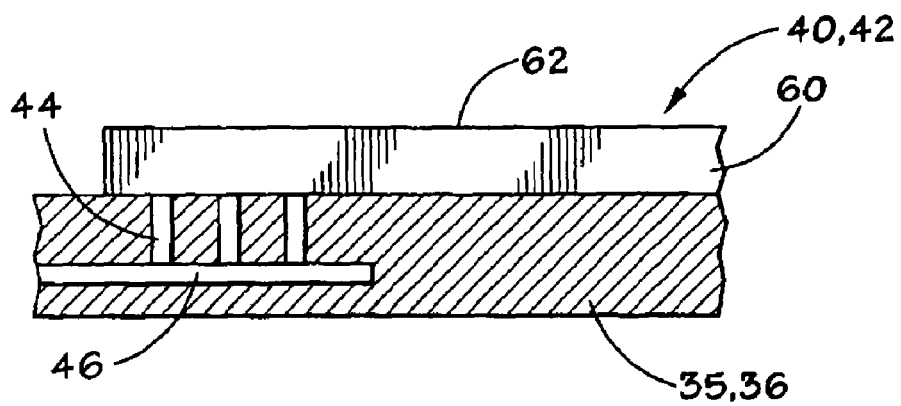
FIG. 4 illustrates a cross-sectional view of an exemplary metalized copper bond pad in accordance with one aspect of the present invention.
Figure 5:
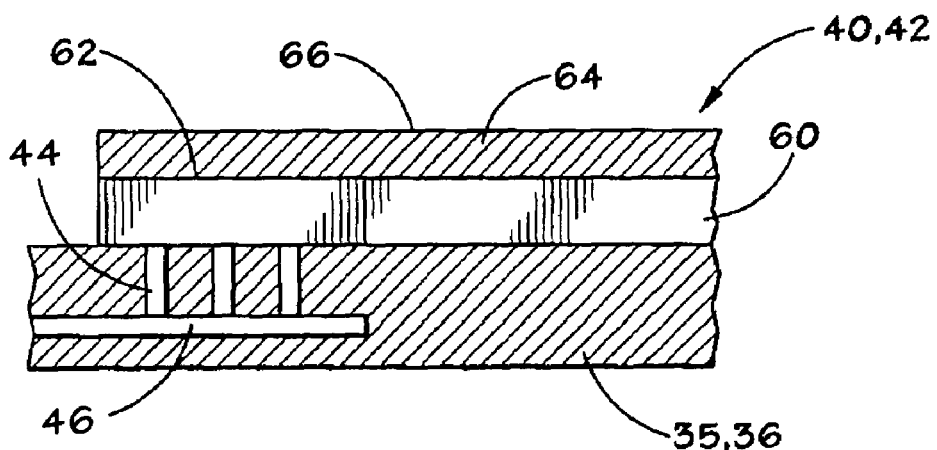
FIG. 5 illustrates a cross-sectional view of an exemplary metalized copper bond pad covered by a layer of nickel in accordance with one aspect of the present invention.

Referring now to FIGS. 4 and 5, a partial cross-sectional view illustrating a bond pad 40 or 42 in accordance with the present invention is depicted. Cross-sectional lines have been omitted for clarity. The bond pad 40, 42 is metalized with a layer of copper 60 presenting a copper surface 62 which is potentially subject to oxidation upon exposure to the atmosphere. The copper layer 60 is disposed upon a substrate 35 or 36 which typically supports a plurality of bond pads. Within the substrate 35 or 36 and beneath the copper layer 60, vias 44 typically connect the copper layer 60 with a trace layer 46 or other electrical interconnectivity structure. Alternatively, a contact structure such as contacts 48 may be disposed upon the surface of the substrate 35 or 36 such that it contacts the copper layer 60 and then forms other electrical interconnections.

As the copper surface 62 is easily subject to oxidation, a layer of nickel 64 may be disposed upon the copper surface 62, as seen in partial cross-sectional view in FIG. 5. The nickel layer 64 acts to prevent the oxidation of the copper surface 62, instead exposing the nickel surface 66 to the oxidizing effects of the atmosphere. The nickel layer 64 is used in place of a layer of gold and is heat-treated to make it more bondable. The heat-treatment is believed to alter the phosphorous content of the nickel surface 66, thereby determining the susceptibility of the nickel surface 66 to oxidation as well as the bondability of the nickel surface 66.

Figure 6:
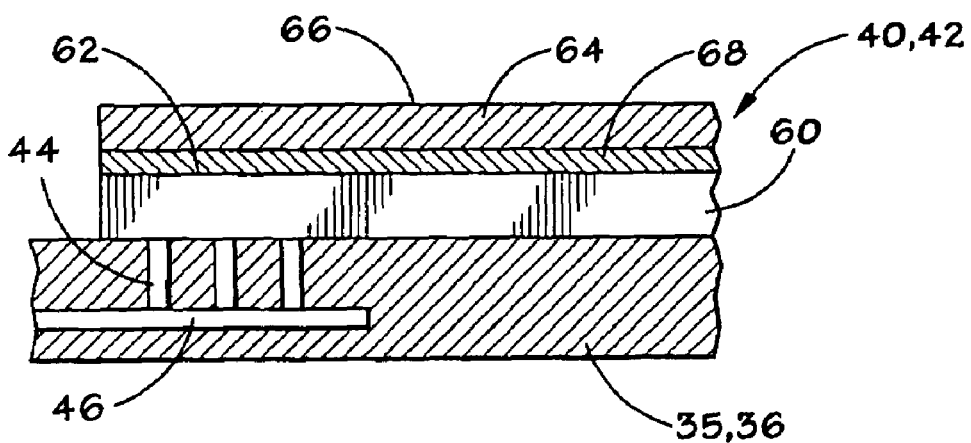
FIG. 6 illustrates a cross-sectional view of an exemplary metalized copper bond pad covered by layers of palladium and nickel in accordance with one aspect of the present invention.

FIG. 6 depicts a typical embodiment of the present invention in which a layer of palladium 68 is deposited as a strike layer between the copper layer 60 and the nickel layer 64 to initiate the deposition of the nickel layer 64. In FIG. 6, cross-sectional lines have been omitted for clarity. The palladium layer 68 may in fact be simply a trace or residual layer or, indeed, may be transitory such that the palladium layer 68 may not be detectable after the layer of nickel 64 is deposited. The presence of the palladium layer 68, however, acts to facilitate nickel deposition by acting as a catalyzing strike. Other catalytic active surfaces, such as platinum or gold, may be used in place of the palladium layer 68 as long as the catalytically active surface is active enough to initiate nickel deposition. Likewise, chemical treatment of the copper surface may be sufficient to render it sufficiently chemically active to initiate nickel deposition. In such circumstances, a palladium layer may not be used and the nickel may be deposited directly upon the copper layer 60, as depicted in FIG. 5.

Figure 7:
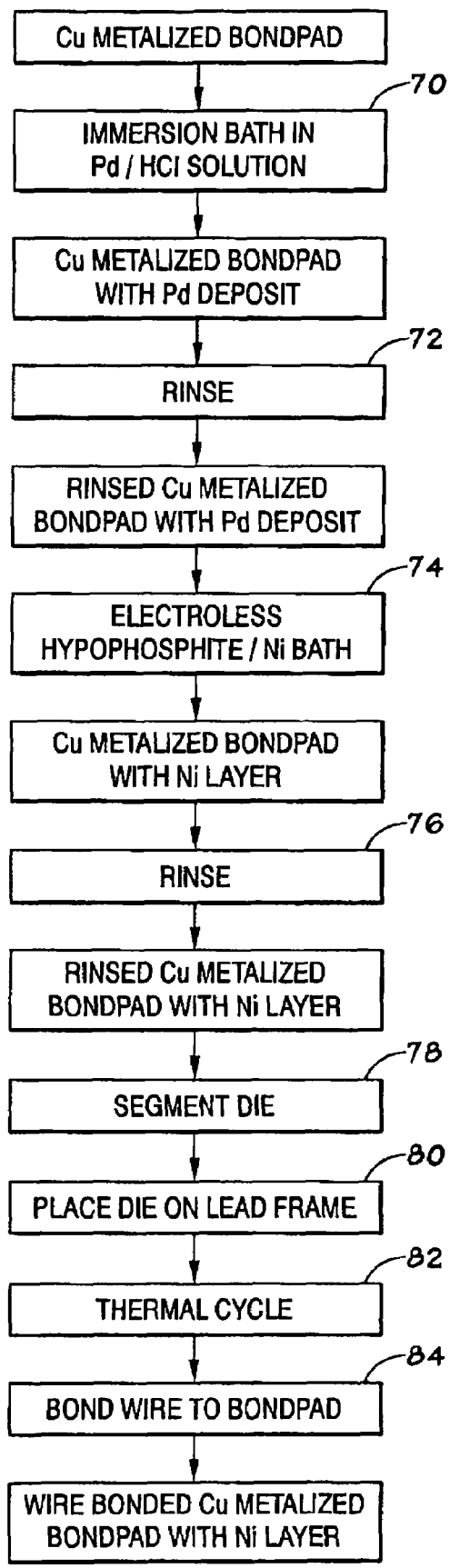
FIG. 7 illustrates a flow chart depicting an exemplary technique for the palladium-facilitated deposition of a nickel layer upon a metalized copper bond pad in accordance with the present invention.

FIG. 7 depicts, by means of a flow chart, an example of the deposition of the nickel layer 64 upon the copper bond pads 40, 42 using a palladium layer 68 as a catalyst for nickel deposition. Specifically, the copper bond pads 40, 42 initially receive a 20 second immersion in a palladium sulfate/sulfuric or hydrochloric acid solution depicted in block 70, resulting in a thin palladium layer 68 being deposited upon the copper layer 60. Subsequently, the copper bond pads 40, 42 are rinsed, in block 72, before receiving an electroless nickel bath, in block 74, where the nickel layer 64 is deposited upon the palladium layer 68. The bond pads 40, 42 are exposed to the electroless nickel bath for between 5 to 60 minutes at between 87° C. to 95° C. in block 74. For example, the bond pads 40, 42 may be exposed to the electroless nickel bath for about 8 minutes at about 93° C. The bath may be comprised of a nickel salt and a hypophosphite reducing agent. In the presence of a stabilizer such as thiourea, the temperature of the nickel bath may be reduced, improving the uniformity of deposition.

The nickel bath deposits the nickel layer 64 with a phosphorous content ranging from 2% to 15%, usually in 6-8% range, upon the copper bond pad 40, 42. The phosphorous content of the nickel layer 64 reduces the solvus melting temperature for the alloy and inhibits oxidation on the surface of the nickel layer 66. The alloying content of the nickel/phosphorous layer 64 is controlled by the chemical reaction: $H_2PO_2 + 2H^+ + e \rightarrow P + 2H_2O$, such that lowering the pH of the hypophosphite bath yields a nickel/phosphorous layer 64 with a higher phosphorous alloying content. Therefore a low pH hypophosphite bath yields a nickel layer 64 with a higher phosphorous content while a high pH hypophosphite bath yields a nickel layer 64 with a lower phosphorous content. One useful embodiment uses a pH of 4.5-5.0.

The resulting nickel layered bond pads are rinsed, as seen in block 76. The resulting die is then segmented, in block 78, and the segments 34 affixed to a lead frame 36 in block 80, typically by means of a die adhesive 37. The fixed die segments 34 and frames 36 are then thermal cycled in an oven for about 1 hour at about 175° C., as depicted in block 82. The formation of oxides during thermal cycling is prevented or reduced by purging the oxygen from the oven by means of a nitrogen or argon enriched atmosphere. If a thermo-setting material has been used as the die adhesive 37, the thermal cycling will serve to cure the adhesive. In addition, it is believed that the thermal treatment is determinative of the phosphorous content of the nickel surface 66. The thermal treatment may therefore be used to control phosphorous content of the nickel surface 66 to enhance wire bonding, possibly by further decreasing the susceptibility of oxidation on the nickel surface 66. Though not depicted in FIG. 7, the act of die segmentation and placement depicted in blocks 78 and 80 may be performed subsequent to the act of thermal cycling depicted in block 82, as necessitated by other production factors.

After thermal cycling and die segment placement, the associated lead frame 36 and die bond pads 40 are wire bonded by conventional techniques to establish electrical connectivity, as depicted in block 84. In one embodiment, parameters suitable for the wire bonding of aluminum have been found suitable for bonding gold wire to the nickel layer deposited upon the copper bond pad.

Figure 8:
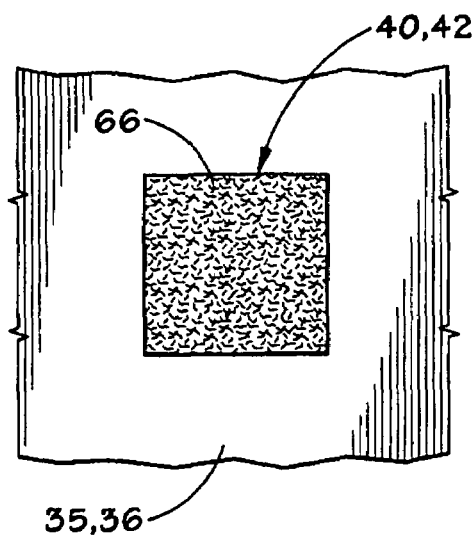
FIG. 8 illustrates an overhead view of a roughened nickel surface electrolessly deposited upon a bond pad.

One additional embodiment is depicted in FIG. 8 where an overhead view of a copper bond pad 40, 42 is depicted. The bond pad 40, 42 of FIG. 8 is disposed upon a substrate 35, 36 and presents a top surface 66 of roughened phosphorous/nickel alloy. The roughened texture may be achieved by numerous means including plasma etching of the nickel layer, or simply leaving the nickel layer unpolished sputter etching or changing stabilizer constituents in the chemical bath. Due to the roughened texture of the nickel surface 66, the shear strength may be increased, allowing more effective wire bonding. The increased surface roughness of nickel surface 66, as depicted in FIG. 8, increases adhesion by adding mechanical bond strength in addition to chemical bond strength.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of producing a contact pad on an electronic circuit, comprising the acts of:
   forming a copper pad on a substrate;
   forming a layer of palladium over the copper pad;
   forming a layer of nickel over the layer of palladium; and
   bonding wire to the layer of nickel.

2. The method of claim 1, wherein the forming the layer of nickel comprises forming a rough layer of nickel.

3. The method of claim 2, wherein the rough layer of nickel comprises unpolished nickel.

4. The method of claim 2, wherein the forming the rough layer of nickel comprises sputtering deposition.

5. The method of claim 2, wherein the forming the rough layer of nickel comprises etching.

6. The method of claim 2, wherein the forming the rough layer of nickel comprises changing constituents in a chemical stabilizer bath.

7. The method of claim 1, further comprising roughening the layer of nickel to increase the shear strength.

8. The method of claim 1, further comprising roughening the layer of nickel to increase adhesion between the layer of nickel and the wire.

9. A method of producing an integrated circuit package comprising the acts of:
   forming at least one copper pad on a substrate, wherein the substrate is located on a chip;
   forming a layer of palladium over the at least one copper pad;
   forming a layer of nickel over the layer of palladium;
   bonding wire to the layer of nickel; and
   providing an electrical signal path from the at least one copper pad to an interconnect structure.

10. The method of claim 9, wherein the forming the layer of nickel comprises forming a rough layer of nickel.

11. The method of claim 10, wherein the rough layer of nickel comprises unpolished nickel.

12. The method of claim 9, layer of nickel has a phosphorous content of 2-15%.

13. The method of claim 9, layer of nickel has a phosphorous content of 2-4%.

14. The method of claim 9, layer of nickel has a phosphorous content of 10-15%.

15. A method of producing a processor-based system comprising the act of:
   coupling one or more processors to one or more memory circuits to produce the processor-based system, wherein the processor based system comprises a contact pad, wherein the contact pad comprises:
      a substrate having a contact region;
      a copper pad disposed on the substrate in electronic contact with the contact region;
      a palladium layer disposed over the copper pad;
      a nickel layer disposed over the palladium layer; and
      one or more wires bonded to the nickel layer.

16. The method of claim 15, wherein the nickel layer comprises a rough layer of nickel.

17. The method of claim 16, wherein the rough layer of nickel comprises unpolished nickel.

18. The method of claim 15, further comprising coupling a computer peripheral, a network device, a computer, a biomedical device, a pacemaker, a vehicular control circuit, an electronic entertainment device, a sound system component, a gaming device, a video display, a communication device, or a combination thereof to the processor-based system.

19. The method of claim 15, wherein at least one of the one or more processors comprises the integrated circuit package.

20. The method of claim 15, wherein at least one of the one or more memory circuits comprises the integrated circuit package.

* * * * *

UNITED STATES PATENT AND TRADEMARK OFFICE
CERTIFICATE OF CORRECTION

PATENT NO. : 7,485,565 B2  Page 1 of 1
APPLICATION NO. : 11/505773
DATED : February 3, 2009
INVENTOR(S) : Jeffery N. Gleason et al.

It is certified that error appears in the above-identified patent and that said Letters Patent is hereby corrected as shown below:

In column 8, line 15, in Claim 18, after "coupling" insert -- at least one of --.

In column 8, line 19, in Claim 18, after "display," insert -- or --.

In column 8, lines 19-20, in Claim 18, after "device" delete ", or a combination thereof".

Signed and Sealed this

Fifth Day of May, 2009

JOHN DOLL
*Acting Director of the United States Patent and Trademark Office*